(12) United States Patent
Fujikata et al.

(10) Patent No.: US 8,467,637 B2
(45) Date of Patent: Jun. 18, 2013

(54) WAVEGUIDE PATH COUPLING-TYPE PHOTODIODE

(75) Inventors: Junichi Fujikata, Tokyo (JP); Jun Ushida, Tokyo (JP); Daisuke Okamoto, Tokyo (JP); Kenichi Nishi, Tokyo (JP); Keishi Ohashi, Tokyo (JP); Tai Tsuchizawa, Kanagawa (JP); Seiichi Itabashi, Kanagawa (JP)

(73) Assignees: NEC Corporation, Tokyo (JP); Nippon Telegraph and Telephone Corporation, Tokyo (JP)

( * ) Notice: Subject to any disclaimer, the term of this patent is extended or adjusted under 35 U.S.C. 154(b) by 419 days.

(21) Appl. No.: 12/598,162

(22) PCT Filed: Apr. 30, 2008

(86) PCT No.: PCT/JP2008/058243
§ 371 (c)(1),
(2), (4) Date: Jan. 7, 2010

(87) PCT Pub. No.: WO2008/136479
PCT Pub. Date: Nov. 13, 2008

(65) Prior Publication Data
US 2010/0119192 A1    May 13, 2010

(30) Foreign Application Priority Data

May 1, 2007 (JP) ................................ 2007-120897
Feb. 21, 2008 (JP) ................................ 2008-039893

(51) Int. Cl.
*G02B 6/12* (2006.01)
*G02B 6/26* (2006.01)
*H01L 29/47* (2006.01)

(52) U.S. Cl.
USPC ............................. 385/14; 385/40; 257/471

(58) Field of Classification Search
None
See application file for complete search history.

(56) References Cited

U.S. PATENT DOCUMENTS 5,625,729 A * 4/1997 Brown .......................... 385/31
7,423,254 B2 * 9/2008 Arend et al. ............... 250/214.1
(Continued)

FOREIGN PATENT DOCUMENTS

JP   55-022813 A   2/1980
JP   59-108376 A   6/1984
(Continued)

OTHER PUBLICATIONS

S. J. Koester, et al., "Germanium-on-Insulator Photodetectors", 2nd International Conference on Group IV Photonics, pp. 171-173, vol. FB1 (10.15-10.45).

(Continued)

*Primary Examiner* — Omar Rojas
(74) *Attorney, Agent, or Firm* — Sughrue Mion, PLLC

(57) ABSTRACT

In a waveguide path coupling-type photodiode, a semiconductor light absorbing layer and an optical waveguide path core are adjacently arranged. An electrode formed of at least one layer is installed in a boundary part of the semiconductor light absorbing layer and the optical waveguide path core. The electrodes are arranged at an interval of $(1/100)\lambda$ to $\lambda$ [$\lambda$: wavelength of light transmitted through optical waveguide path core]. At least a part of the electrodes is embedded in the semiconductor light absorbing layer. Embedding depth from a surface of the semiconductor light absorbing layer is a value not more than $\lambda/(2 ns)$ [ns: refractive index of semiconductor light absorbing layer]. At least one layer of the electrode is constituted of a material which can surface plasmon-induced.

21 Claims, 9 Drawing Sheets

U.S. PATENT DOCUMENTS

2003/0010979 A1* 1/2003 Pardo et al. ............. 257/53
2006/0093967 A1* 5/2006 Block ................... 430/321

FOREIGN PATENT DOCUMENTS

| | | | |
|---|---|---|---|
| JP | 63-119259 A | 5/1988 |
| JP | 63-160373 A | 7/1988 |
| JP | 03-211886 A | 9/1991 |
| JP | 3290606 A | 12/1991 |
| JP | 04-171405 A | 6/1992 |
| JP | 04-363073 A | 12/1992 |
| JP | 06-244447 A | 9/1994 |
| JP | 08-204225 A | 8/1996 |
| JP | 08-204226 A | 8/1996 |
| JP | 10-261809 A | 9/1998 |
| JP | 10-509806 A | 9/1998 |
| JP | 2000-171763 A | 6/2000 |
| JP | 2002-076410 A | 3/2002 |
| JP | 2003-504659 A | 2/2003 |
| JP | 2003-520438 A | 7/2003 |
| JP | 2004-109965 A | 4/2004 |
| JP | 2005-150291 A | 6/2005 |
| WO | 2005/029164 A1 | 3/2005 |
| WO | 2005092037 A2 | 10/2005 |

OTHER PUBLICATIONS

Tineke Thio, et al., "Giant optical transmission of sub-wavelength apertures: physics and applications", Nanotechnology, 2002, pp. 429-432, vol. 13.

Communication dated Aug. 29, 2012 from the Japanese Patent Office in counterpart Japanese application No. 2009-513019.

* cited by examiner

WAVEGUIDE PATH COUPLING-TYPE PHOTODIODE

CROSS REFERENCE TO RELATED APPLICATION

This application is a National Stage of International Application Number PCT/JP2008/058243 filed Apr. 30, 2008, claiming priority based on Japanese Patent Application Numbers 2007-120897 and 2008-039893, filed May 1, 2007 and Feb. 21, 2008 respectively, the contents of all of which are incorporated herein by reference in their entirety.

APPLICABLE FIELD IN THE INDUSTRY

The present invention relates to a photodiode for converting, for example, an optical signal including infrared-ray light into an electric signal at a high speed.

BACKGROUND ART

It is very attractive from a viewpoint of a cost and a yield to monolithically integrate and circuitize a photodetector with a silicon electronic technology. For example, a silicon photoreceiver monolithically integrated and circuitized on a chip identical to that of a CMOS circuit (for example, a silicon photodiode) is one of attractive substitutes for a hybrid photoreceiver (for example, a InGaAs photodiode connected to the CMOS circuit or a GaAs circuit). The photoreceiver monolithically integrated and circuitized is manufactured through a standard silicon process. And, it is expected that the above photoreceiver is manufactured at a lower cost as compared with the hybrid-designed photoreceiver.

The photodiode is employed as a means for converting the optical signal into the electric signal at a high speed. A pin type photodiode is representative thereof. The pin type photodiode has a construction in which an i layer of an intrinsic semiconductor has been put between a p layer of a p-type semiconductor and an n layer of an n-type semiconductor. And, when an inverse bias voltage is applied to the pin type photodiode, almost all region of the i layer having a high resistance becomes a depletion layer of an electric charge carrier. A photon of incident light is mainly absorbed in the i layer. And electron/positive hole pairs are generated. Each of the generated electron and positive hole drifts within the depletion layer in an opposite direction to the other due to the inverse bias voltage. This allows a current to flow. And it is detected as a signal voltage with a load resistance. Main factors for governing a response speed of this optoelectric conversion are a circuit time constant and a carrier drift time. The circuit time constant is governed by a product of the load resistance and an electric capacity being produced by the depletion layer. The carrier drift time is a time necessary for the electron (positive hole) passing through the depletion layer.

There exists a Schottky type photodiode as a photodiode of which the carrier drift time is short. This photodiode is a photodiode having a construction in which a semitransparent metal film is in contact with the n layer (or n$^-$ layer) of the semiconductor. A Schottky junction is formed in the neighborhood of an interface in which the n layer (or n$^-$ layer) and the semitransparent metal film contact each other. Diffusion of the electron from the semitransparent metal film to the n layer (or n$^-$ layer) occurs in the neighborhood of this Schottky junction. And the depletion layer is formed. When the incident light is radiated in this state, the electron is generated in the n layer (or n$^-$ layer). And, the foregoing electrons drift within the depletion layer due to the inverse bias voltage. Further, the light absorption on the element surface layer can be effectively utilized. For example, the pin type photodiode necessitates the i layer (depletion layer) having a sufficient thickness because of absorption of the photon. However, the depletion layer of the Schottky type photodiode can be made thin. Thus, the carrier drift time can be shortened. Additionally, it has been proposed to adopt a lateral electrode structure, thereby to make a gap between the electrodes short so as to thin the depletion layer for the pin type photodiode as well (see Non-patent document 1). However, this technique, which enables the high speediness, is poor in a light absorption efficiency on the surface layer of the semiconductor. And, the high sensitivity is difficult to attain.

By the way, making a value of the load resistance small so as to make the circuit time constant short causes the voltage of a reproduction signal that is takable to lower. Thus, improving S/N of the reproduction signal (reducing an error in the reading-off) necessitates reducing an electric capacity of the depletion layer. In particular, making the depletion layer thin so as to make the carrier drift time short causes the electric capacity to be increased. Thus, it is necessary to reduce an area of the depletion layer (or the Schottky junction) so as to attain the high speediness. However, reducing the junction area causes a utilization efficiency of the signal light to lower. Resultantly, the S/N of the reproduction signal lowers.

In consideration of the above-mentioned problems, utilization of a metal surface plasmon (or a photonic crystal structure) has been proposed in an optoelectric conversion device. That is, an attempt for attaining the high speediness/miniaturization for the device is in progress.

For example, the technology of Patent document 1 has been proposed. A photodetector of the metal/semiconductor/metal (MSM) type in which two electrodes have been mounted on an identical surface of the semiconductor have been disclosed in this document. This MSM type photodetector is one kind of the photodiodes having the Schottky junction in the neighborhood of the two electrodes. One part of the light having transmitted through the electrode surface is absorbed in a semiconductor layer. And a photocarrier is generated. In this MSM type photodetector, making the semiconductor thick for a purpose of enhancing a quantum efficiency leads to an increase in a propagation distance of the photocarrier. As a result, an operational speed lowers. In the Patent document 1, so as to prevent this operational speed from lowering, it has been proposed to form the metal electrode along periodic roughness. That is, a scheme has been proposed for efficiently coupling the incident light to the surface plasmon of the metal electrode, and allowing it to propagate inside the photodetector.

Further, the technology of Patent document 2 has been proposed. The method has been disclosed of manufacturing an MSM type light receiving element in this document. That is, the method has been disclosed of forming the metal film on the semiconductor, partially oxidizing this metal film, and forming a light transmissive insulating pattern.

Further, the technology of Patent document 3 has been proposed. It has been disclosed in this document that the width of the light transmissive insulating pattern is made equal to or less than a wavelength, and proximity field light that occurs in an edge of the metal film existing in both sides of the light transmissive insulating pattern is utilized. Further, it has been disclosed that the response speed of this MSM type light receiving element is made fast.

Further, the technology of Patent document 4 has been proposed. In this document, an optoelectronic coupler has been disclosed in which a positive polarity and a negative polarity of the crossed finger type metal electrode, which are systematically spaced on the semiconductor, have been arranged in such a manner that they face each other as a nested function. Further, it is described that the incident light is coupled to each of the transmissive light, the reflection light, the surface plasmon, a polariton, etc. with the resonance. Further, it is also described that the optoelectronic coupler can be employed as an MSM type light receiving element. Further, it is also described that the photocarrier is intensified owing to the coupling of the incident light and the surface plasmon. However, in the case of employing the optoelectronic coupler described in the Patent document 4 as an MSM type light receiving element, reducing an irradiation area of the incident light for a purpose of reducing the electric capacity of the depletion layer leads to a decline in the intensity (S/N) of the detection signal. Further, there is no description of the coupling of the light energy being transmitted in the optical waveguide path and the semiconductor layer in the Patent document 4.

Further, the technology of Patent document 5 has been proposed. A photovoltaic device having periodically-arranged apertures (or concave portions) formed on one of two electrodes holding a plurality of spherical semiconductors each having a pn junction between them has been disclosed in this document. This photovoltaic device utilizes the resonance of the incident light and the surface plasmon in the electrode having the periodic shape. However, there is no description of making the depletion layer thin and yet making the area small for a purpose of attaining the high speediness of the optoelectric conversion in the Patent document 5.

Further, the technology of Patent document 6 has been proposed. An MSM light receiving element having the light absorption layer as a layer having a multilayer film structure so as to form a photonic band has been disclosed in this document. Further, it is described that making a group velocity of the light, which is absorbed and transmits, small allows the physical absorption layer to be made thin. Further, it is described that with this, the light receiving efficiency is enhanced. However, the point of reducing the junction area in the MSM junction and making the element capacity small has not been realized also in this structure.

Further, the technology of Patent document 7 has been proposed. An MSM type photodetector in which the metal electrode has been formed with the semiconductor absorption layer penetrated by it has been disclosed in this document.

Further, the technology of Patent document 8 has been proposed. An optical transmitter utilizing a metal film having the aperture and the surface shape being periodically changed has been disclosed in this document. However, the technology described in the Patent document 8 is not a technology associated with the optoelectric conversion device. Additionally, it is described that, notwithstanding a single aperture, forming an array of the periodic grooves around the above aperture makes it possible to intensify the light that propagates. That is, it is described that the light that propagates can be intensified as compared with the case of having no array of the periodic grooves. However, it is known that total energy of the light that transmits attenuates as compared with the energy of the incident light. For example, the Non-patent document 2 says that the total energy of the light that transmits through the aperture of which the diameter is equal to or less than 40% of a wavelength attenuates to 1% of the incident light energy or less. Thus, the high S/N is not gained even though the light receiving element is irradiated with the propagation light from the optical transmitter described in the Patent document 8.

Further, the technology of Patent document 9 has been proposed. A structure has been disclosed in which a specific wavelength is optically coupled in a selective manner by employing a diffraction grid causing localized resonance to occur between the optical waveguide paths has been disclosed in this document. However, this technology is a technology relating to the optical coupling between the optical waveguide paths. And, the effect of localizedly entrapping the coupled light energy deemed to be necessary for the light receiving element as well as the structure in which the diffraction grid is used both as an original function and an electrode have not been realized.

Further, the technology of Patent document 10 has been proposed. An optical waveguide path structure utilizing the surface plasmon resonance has been disclosed in this document. However, in this technology as well, the coupling structure of the optical waveguide path and the photodiode, and the propagation structure of the surface plasmon are not utilized.

Patent document 1: JP-P1984-108376A
Patent document 2: JP-P1996-204225A
Patent document 3: JP-P1996-204226A
Patent document 4: JP-P1998-509806A
Patent document 5: JP-P2002-76410A
Patent document 6: JP-P2005-150291A
Patent document 7: JP-P2003-520438A
Patent document 8: JP-P2000-171763A
Patent document 9: JP-P2003-504659A
Patent document 10: JP-P2004-109965A
Non-Patent document 1: S. J. Koester, G. Dehlinger, J. D. Schaub, J. O. Chu, Q. C. Quyang, and A. Grill, "Germanium-on-Insulator Photodetectors", 2nd International Conference on Group IV Photonics, FB 12005 (page 172, FIG. 3)
Non-Patent document 2: Tineke Thio, H. J. Lezec, T. W. Ebbesen, K. M. Pellerin, G. D. Lewen, A. Nahata, and R. A. Linke, "Giant optical transmission of sub-wavelength apertures: physics and applications", Nanotechnology, vol. 13, pp. 429-432, FIG. 4.

DISCLOSURE OF THE INVENTION

Problems to be Solved by the Invention

The metal-semiconductor-metal (MSM) photodiode offers flatness and compatibility with a silicon LSI.

However, coupling the above photodiode and the optical waveguide path by means of packing for a purpose of integrating and optically coupling the former with the latter arouses the problems such as an alignment precision and a cost. Further, when the former is monolithically integrated, a production precision is required for forming a mirror structure with a wafer process. For this reason, a mass productiveness is poor.

Further, the photodetector employing Si (or SiGe), as a rule, exhibits a slow response because of a long carrier life time (1 to 10 µs) and a low light absorption ratio (10 to 100/cm). The Schottky junction type photodiode, which employs a compound semiconductor, exhibits a fast response. However, the effective light receiving area becomes small due to the metal electrode. For this reason, the sensitivity lowers. A lateral electrode structure has been proposed for the pin type photodiode for a purpose of layer-thinning the depletion layer. In this case, the fast responsiveness can be attained by making a distance between the electrodes small. However, the high sensitivity is difficult to attain.

And, so as to make the response of the photodiode fast, it is important to thin the light absorption layer, and make the carrier drift time short. Further, it is also important to make the light receiving area (the junction capacity) small, and make the circuit time constant small. Additionally, as a rule, the light receiving sensitivity and the high speediness are in a relation of trade-off with each other.

Thus, the present invention has been accomplished in order to solve the above-mentioned problems, and an object thereof is to provide a photodiode in which the light receiving sensitivity and the fast responsiveness are compatible with each other. In particular, an object thereof is to provide a photodiode that is small in the volume of the light absorption layer, and yet enables high integration and low power consumption to be realized.

Means for Solving the Problem

The foregoing problems are solved by a waveguide path coupling-type photodiode having a semiconductor light absorption layer and an optical waveguide path core formed adjacently to each other, which is characterized in that: an electrode that is comprised of at least one layer is formed in a boundary between the foregoing semiconductor light absorption layer and the foregoing optical waveguide path core; the foregoing electrodes are arranged at an interval of $(1/100)\lambda$ to $\lambda$ (where $\lambda$: a wavelength of light that propagates through the foregoing optical waveguide path core); at least one part of the above electrode is buried into the foregoing semiconductor light absorption layer; and at least one layer of the foregoing electrode is configured of a material capable of inducing a surface plasmon.

Further, the present invention provides an optical wiring system having the foregoing waveguide path coupling-type photodiode formed on a light receiving portion thereof.

Further, the present invention provides an optical interconnection module, which is characterized in including: a Si substrate having the above-mentioned waveguide path coupling-type photodiode formed thereon; and an electronic circuit formed monolithically with the foregoing waveguide path coupling-type photodiode on the foregoing Si substrate.

An Advantageous Effect of the Invention

The photodiode of the present invention allows the light having propagated through the optical waveguide path core to be effectively entrapped into the light absorption layer. And, the efficient optoelectric conversion is enabled even though the junction area is very small. Further, the photodiode, which is small in the volume of the light absorption layer, and yet enables the high integration and the low power consumption, is realized. Further, the photodiode in which the light receiving sensitivity and the fast responsiveness are compatible with each other can be attained.

And, in particular, the present invention is suitable for an information process employing an optical wiring within an LSI tip (or between chips).

DESCRIPTION OF NUMERALS

Figure 1:
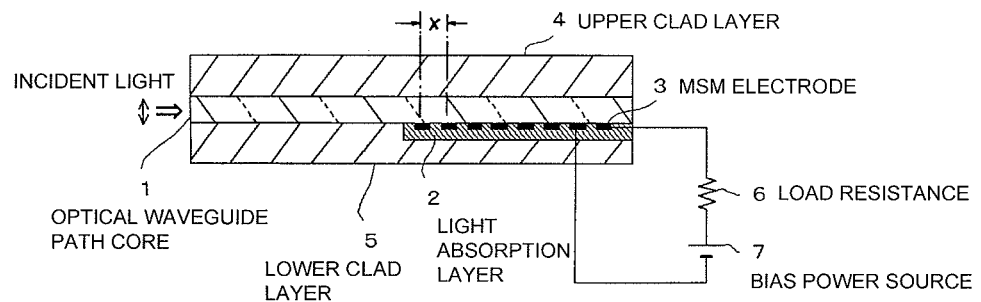
FIG. 1 is a cross sectional view of the waveguide path coupling-type photodiode of a first embodiment.

1 optical waveguide path core
2 light absorption layer
3 MSM electrode
4 upper clad layer
5 lower clad layer
11 Schottky electrode
12 opposite electrode layer
21 p electrode
22 n electrode
23 metal film
31 intermediate layer
41 forbidden band grating
42 reflective film

BEST MODE FOR CARRYING OUT THE INVENTION

The present invention is a waveguide path coupling-type photodiode. In particular, the present invention is a waveguide path coupling-type photodiode having a semiconductor light absorption layer and an optical waveguide path core formed adjacently to each other. For example, the present invention is a waveguide path coupling-type photodiode having the semiconductor light absorption layer and the optical waveguide path core laminately formed therein. The electrode (the electrode that is configured of one layer or more) is formed in a boundary portion (in the neighborhood of an interface) between the foregoing semiconductor light absorption layer and the foregoing optical waveguide path core. The foregoing electrodes are arranged at an interval of $(1/100)\lambda$ to $\lambda$ (where $\lambda$: a wavelength of the light that propagates through the foregoing optical waveguide path core). The foregoing electrode is, for example, a comb type electrode. And, with the case of the comb type electrode, a distance between the comb teeth thereof is $(1/100)\lambda$ to $\lambda$. Additionally, the electrode, as rule, is configured so to form a pair. In this case, as one example, the case that both electrodes of a pair are a comb type electrode, respectively, can be listed. At this time, normally, the comb type electrode and the comb type electrode assume a form such that the comb teeth of one electrode are engaged with the comb teeth of the other electrode in many cases. Thus, in such a time, the foregoing interval is a distance (shortest distant) between the comb tooth of one comb type electrode and the comb tooth of the other comb type electrode. The foregoing electrode (for example, at least one part thereof in the thickness direction of the electrode (lower portion side)), but desirably, all of it in the thickness direction of the electrode) is buried into the foregoing semiconductor light absorption layer. This buried depth (the buried depth from a surface of the foregoing semiconductor light absorption layer) is, particularly, a depth of the value equal to or less than $\lambda/(2 ns)$ (where ns: a refractive index of the foregoing semiconductor light absorption layer). Additionally, the case that the foregoing value is zero is included. Further, the foregoing electrode (the electrode formed in the boundary portion between the foregoing semiconductor light absorption layer and the foregoing optical waveguide path core) is configured of the material capable of inducing the surface plasmon.

As one example, there exists the case that the electrodes facing each other both are formed in the boundary portion between the foregoing semiconductor light absorption layer and the foregoing optical waveguide path core. In this case, the metal-semiconductor-metal junction (MSM junction) is configured of the foregoing electrode and the foregoing semiconductor light absorption layer. At this time, the metal-semiconductor junction that is configured of at least one electrode, out of the foregoing electrodes facing each other, and the foregoing semiconductor light absorption layer is desirably a Schottky barrier type junction.

Further, as another example of the above-mentioned photodiode, the following can be listed. That is, one electrode, out of the foregoing electrodes facing each other, is configured of a lamination of the foregoing material capable of inducing the surface plasmon and the p electrode. Further, the other electrode, out of the foregoing electrodes facing each other, is configured of a lamination of the foregoing material capable of inducing the surface plasmon and the n electrode. And, the above photodiode is a photodiode in which the p-i-n junction has been configured of the foregoing electrode and the foregoing semiconductor light absorption layer. And, also in the pin photodiode having such a lateral electrode structure, the metal buried and arranged in the light absorption layer entraps the light energy into the light absorption layer neighboring the $p^+$ electrode and $n^+$ electrode owing to the surface plasmon, and generates an optical electric field that is locally strong.

Further, as yet another example of the above-mentioned photodiode, the following can be listed. That is, one electrode, out of the electrodes facing each other, is formed in the boundary portion between the foregoing semiconductor light absorption layer and the foregoing optical waveguide path core. The other electrode, out of the electrodes facing each other, is formed in a side opposite to the side of the foregoing one electrode with the foregoing semiconductor light absorption layer put between both electrodes. And, the metal-semiconductor junction that is configured of the foregoing one electrode and the foregoing semiconductor light absorption layer is a Schottky barrier type junction. Also in this case, the special feature of the photodiode that the high efficiency and the fast responsiveness are compatible with each is attained similarly to the case of the MSM junction structure.

Further, as yet another example of the above-mentioned photodiode, the following can be listed. That is, the intermediate layer is formed in the boundary portion between the foregoing semiconductor light absorption layer and the foregoing optical waveguide path core. This intermediate layer is a layer of which a refractive index n is ncore to ns (where ncore: a refractive index of the foregoing optical waveguide path core and ns: a refractive index of the foregoing semiconductor light absorption layer). With this, the efficiency of the optical coupling of the light absorption layer and the optical waveguide path core is improved.

Further, as yet another example of the above-mentioned photodiode, the following can be listed. That is, the above photodiode is a photodiode having a metal grating structure for reflecting the light formed therein. This metal grating structure, which holds the foregoing electrode formed in the boundary portion between the foregoing semiconductor light absorption layer and the foregoing optical waveguide path core between both sides, is formed in a position of a side opposite to the side in which the light propagates through the foregoing optical waveguide path core. And, the light having propagated is reflected owing to the metal grating structure formed in this position. Thus, a coupling length of the light absorption layer and the optical waveguide path core can be shortened. Additionally, this metal grating structure prevents the light having propagated through the foregoing optical waveguide path core from causing the plasmon resonance. Further, it is also possible to forming a reflective film instead of the metal grating structure. That is, the reflective film may be formed in an end surface of the foregoing optical waveguide path core, which is positioned in a side opposite to the side in which the light propagates through the foregoing optical waveguide path core, with the foregoing electrode formed in the boundary portion between the foregoing semiconductor light absorption layer and the foregoing optical waveguide path core put between both sides. Needless to say, both of the metal grating structure and the reflective film may be formed.

Further, as yet another example of the above-mentioned photodiode, the following can be listed. That is, the clad layer is formed for the foregoing optical waveguide path core. The thickness of this clad layer meets a thickness L1<a thickness L2. Additionally, the thickness L1 is a thickness of the foregoing clad layer existing in a position in which the clad layer faces the foregoing electrode with the foregoing optical waveguide path core put between both. The thickness L2 is a thickness of the foregoing clad layer laminated upon the foregoing optical waveguide path core through which the light propagates. For example, the thickness L2 is a thickness obtained by thinning the thickness of the foregoing clad layer existing in a position in which it faces the foregoing electrode. As a changed thickness, the gradually changed thickness can be listed. However, the linearly thinned thickness is desirable. Or, the thickness thinned in a curved-line shape is also acceptable. That is, the taperedly reduced thickness is desirable. Additionally, herein, the thickness of the clad layer existing in a position in which the clad layer faced the foregoing electrode with the foregoing optical waveguide path core put between both was specified. Thus, it seems that the clad layer is formed only in a position in which it faces the foregoing electrode. However, the fact is that the foregoing clad layer is formed so as to surround the foregoing optical waveguide path core in almost cases. For example, the foregoing optical waveguide path core and the foregoing clad layer are coaxially formed.

Further, as yet another example of the above-mentioned photodiode, the following can be listed. That is, the junction area (the junction region for generating and sweeping the photocarrier) in the interface between the foregoing electrode and the foregoing semiconductor light absorption layer is 100 $\mu m^2$ or less. More desirably, the foregoing junction area is 10 $\mu m^2$ or less. And, making the junction region small allows the electric capacity in the junction to be made small. As a result, the circuit time constant in the case of performing a high-frequency operation for the photodiode can be lowered to several picoseconds or less. Further, a high-frequency operation of several tens of Giga Hertz or more is realized. Further, the foregoing semiconductor light absorption layer is 1 $\mu m$ or less in its thickness. More desirably, it is 500 nm or less in its thickness.

Further, as yet another example of the above-mentioned photodiode, the following can be listed. That is, the material capable of inducing the surface plasmon is Al. Or, it is Ag. Or, it is Au. Or, it is Cu. Or, it is an alloy of the foregoing metals. And, the electrode is configured of one layer employing the foregoing material. Additionally, the electrode may be a layered film with two layers or more. So as to form the Schottky junction, the substrate layers such as Cr, Ta, and Ni are desirably formed. Further, using Ti etc. as a substrate film makes it possible to form an Ohmic junction.

Further, as yet another example of the above-mentioned photodiode, the following can be listed. That is, the foregoing intermediate layer is configured of aluminum oxide. Or, it is configured of silicon oxide. Or, it is configured of tantalum oxide. Or, it is configured of zirconium oxide. Or, it is configured of hafnium oxide. Or, it is configured of the oxide of two metal elements or more constituting the foregoing ceramic. This intermediate layer could be may be a one-layer film. Or, it may be a layered film with two layers or more.

Further, as yet another example of the above-mentioned photodiode, the following can be listed. That is, the above-mentioned optical waveguide path core is one configured of SiON. This optical waveguide path core made of SiON is configured, for example, with a plasma CVD (CVD: Chemical Vapor Deposition).

Further, as yet another example of the above-mentioned photodiode, the following can be listed. That is, the above-mentioned semiconductor light absorption layer is one configured of Si. Or, it is one configured of $Si_xGe_{1-x}$ (where X is a numerical number of 0 to 1). Or, it is one configured of Ge. Or, it is one configured of GaN. Or, it is one configured of GaAs. Or, it is one configured of GaInAs. Or, it is one configured of GaInP. Or, it is one configured of InP. Or, it is one configured of a composite of the foregoing materials. Additionally, when the above semiconductor light absorption layer is configured of $Si_xGe_{1-x}$ ($0 \leq x < 1$) so as to gain the Scottky junction with the semiconductor light absorption layer, the Ni—Ge alloy layer is desirably formed in the junction interface between the foregoing electrode and the foregoing semiconductor light absorption layer.

The above-mentioned waveguide path coupling-type photodiode can be employed for the light receiving portion of the optical wiring system (in particular, the optical wiring system on the integrated circuit).

Further, the above-mentioned waveguide path coupling-type photodiode can be formed on the Si substrate, thereby to monolithically form the electronic circuit on this Si substrate. With this, the optical interconnection module can be gained.

The present invention will be furthermore explained in details.

Embodiment 1

Figure 2:
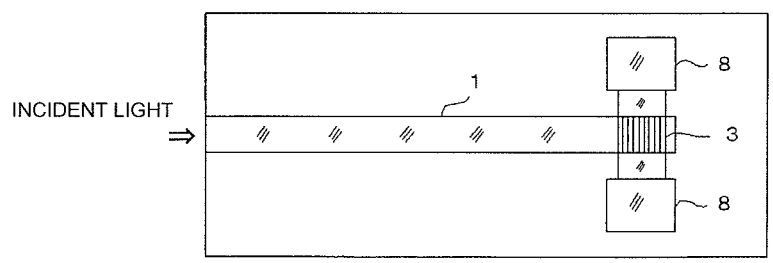
FIG. 2 is a plan of the waveguide path coupling-type photodiode of the first embodiment.
Figure 3:
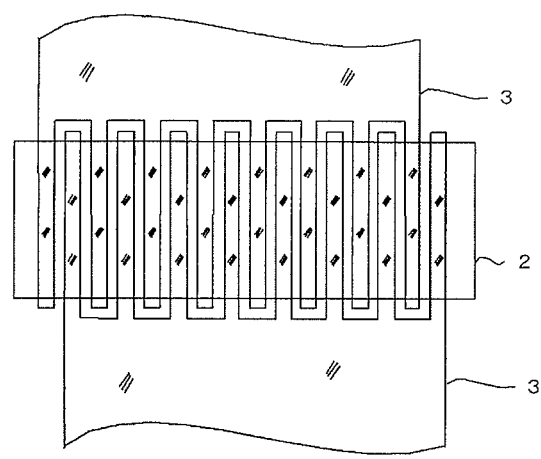
FIG. 3 is a partially enlarged view of FIG. 2.

Each of FIG. 1 to FIG. 3 is a view for explaining the first embodiment of the present invention. FIG. 1 is a cross sectional view. FIG. 2 is a plan. FIG. 3 is a partially enlarged view of FIG. 2.

Additionally, this embodiment is an example of the MSM photodiode.

This waveguide path coupling-type photodiode is one formed on one part of the semiconductor layer of which the surface has been insulated, for example, SOI (Silicon-on-Insulator). That is, the clad layer is formed so as to surround an optical waveguide path core 1. Additionally, for convenience, in FIG. 1, the clad layer being positioned on the upper side of the optical waveguide path core 1 is called an upper clad layer 4. The clad layer being positioned on the lower side of the optical waveguide path core 1 is called a lower clad layer 5. As can be seen from FIG. 1, the semiconductor light absorption layer 2 is formed in the boundary portion (interface portion) between the optical waveguide path core 1 and the lower clad layer 5. Additionally, the semiconductor light absorption layer 2 borders the optical waveguide path core 1.

One pair of the electrodes 3 (for example, MSM electrodes) are formed on the semiconductor light absorption layer 2. This one pair of the electrodes 3 are a comb type electrode, respectively (see FIG. 1 and FIG. 3). And, the electrodes are formed so that the comb teeth of one electrode are positioned between the comb teeth of the other electrode (the former is engaged with the latter: the former faces with the latter). In particular, the one pair of the MSM electrodes 3 (comb type electrodes) are formed so that the distance between the comb teeth thereof (the distance between the comb tooth of one electrode and the comb tooth of the other electrode: it is indicated with x in FIG. 1) is $(1/100)\lambda$ to $\lambda$ (where $\lambda$: a wavelength of the light that propagates through the foregoing optical waveguide path core).

Further, as can be seen from FIG. 1, the upper surface of the electrode 3 borders the optical waveguide path core 1. Thus, the electrode 3 assumes a form of being buried into the semiconductor light absorption layer 2. This buried depth is, particularly, a depth of a value equal to or less than $\lambda/(2\,ns)$ (where ns: a refractive index of the foregoing semiconductor light absorption layer). Furthermore, it is a depth of a value less than $\lambda/(2\,ns)$. Additionally, $\lambda/(2\,ns)$ is a depth in which the proximity field light oozes out.

The MSM electrode 3 is configured of the conductive material capable of inducing the surface plasmon.

Additionally, as can be seen from FIG. 1, a load resistance 6 and a bias power source 7 are connected to the electrode 3. And, the light power being transmitted is optically coupled owing to the MSM junction formed in the interface between the optical waveguide path core 1 and the semiconductor light absorption layer 2. And, when a bias direct current is applied by electrode pads 8 formed in both sides of the MSM electrode 3, a current signal is taken out.

In the waveguide path coupling-type photodiode of the present invention, a diffraction phenomenon occurs by the MSM electrode (the conductive material capable of inducing the surface plasmon) 3 buried into the semiconductor light absorption layer 2. And, the surface plasmon is induced. As a result, the strong proximity field is induced in the junction interface. Thereby, the light is entrapped into the semiconductor light absorption layer 2 when the refractive index of the semiconductor light absorption layer 2 is larger as compared with that of the optical waveguide path core 1.

The proximity field light due to the surface plasmon changes a strength distribution thereof and a range, in which it oozes out, under an influence by the electrode arrangement, and the refractive index and the light absorption coefficient of the semiconductor light absorption layer. In the present invention, the electron/positive hole pairs (photocarriers) are generated in a very small region of the light absorption layer. And, causing the depleted region in the semiconductor light absorption layer 2 being formed by the electrode to coincide with the region in which the photocarriers are generated due to the proximity field light allows the efficient photocarrier generation and the local photocarrier drift to be realized. As a result, the high quantum efficiency and the fast responsiveness are exhibited.

Conventionally, the metal electrode formed on the surface of the semiconductor blocks the light receiving surface of the photodiode. For this, the light receiving sensitivity declines. Further, also in the case of adopting the electrode interval for causing the surface plasmon resonance, the region in which the optical electric field strength is strong exists in a region outside the light absorption layer. For this, the photocarriers cannot be generated efficiently. On the other hand, in the present invention configured as mentioned above, the plasmon resonance occurs in the interface between the semiconductor light absorption layer 2 and the optical waveguide path core 1 due to light incidence by a TM wave. For this, it becomes possible that the region in which the optical electric field strength is maximized, and the semiconductor depletion layer region, being a light absorption layer, coincide with each other. And, the efficient optical coupling with the light that propagates through the optical waveguide path core 1 is enabled even though the semiconductor light absorption layer 2 is thin. Further, the excellent sensitivity feature is attained.

As a material of the MSM electrode 3, for example, Al is employed because it induces the surface plasmon. Ag may be employed instead of Al. Further, Au may be employed instead of Al. Further, Cu may be employed instead of Al. Further, an alloy of the foregoing metals may be employed.

A dispersion relation $k_{sp}$ of the surface plasmon is expressed with the following equation.

$$k_{SP} = \omega/c \{ (\epsilon_m \cdot \epsilon_d)/(\epsilon_m + \epsilon_d) \}^{1/2}$$

Additionally, $\epsilon_m$ is a permittivity of the metal for generating the surface plasmon. $\epsilon_d$ is a permittivity of a dielectric substance bordering the foregoing metal.

Further, a propagation length $L_{spp}$ of the surface plasmon is expressed with the following equation.

$$L_{spp} = C/\omega \{ (\epsilon_m' + \epsilon_d)/\epsilon_m' \}^{3/2} \cdot \epsilon_m'^2 / \epsilon_m''$$

Additionally, a complex permittivity of the metal $\epsilon_m = \epsilon_m' + i\epsilon_m''$.

That is, the optical loss of the surface plasmon largely depends upon a value of the square of an imaginary part and an actual part of the permittivity of the metal film constituting the MSM electrode 3. Thus, in the present invention, the metals as described above are desirably employed.

Further, for a purpose of a reduction in a propagation loss of the surface plasmon, the random roughness of the metal surface is desirably made small. Thus, the underlayer (underlayer of the electrode) that is comprised of Ta, Cr, Ti, Zr, etc. is desirably formed from this viewpoint. Or, the alloying of the metal film by adding the element such as Nb by a very small amount is also desirable.

In particular, the optical waveguide path of which a difference of the refractive index between the optical waveguide path core 1 and the clad layer 4 is 3% or more is desirably utilized in order to entrap the light into a region of which the size is equal to or less than 10 μm² within the optical waveguide path core 1. Such a channel-type optical waveguide path has a structure in which the circumference of the optical waveguide path core 1 is surrounded by the medium having a smaller refractive index. And, the larger a difference of the refractive index between the core and the clad layer is, more strongly the light is entrapped into the core while repeating total internal reflection. And, even though the waveguide path is abruptly bent at a small curvature, the light is wave-guided along it. And, with the case that a difference of the refractive index is 3% or more, a light coupling length of 10 μm or less can be realized. Further, with the case that a difference of the refractive index is 10% to 40% or so, a light coupling length of 6 μm or less can be realized.

For example, when the refractive index of the core=3.4, the section size=0.3 μm×0.3 μm, and the refractive index of the clad made of $SiO_2$ around the core=1.45 to 1.47, assuming the semiconductor to be a Si semiconductor etc., a mode size of the light is reduced to a size almost identical to that of the waveguide path core. The wave-guiding loss due to the light absorption occurs in the Si waveguide path with the case that the wavelength of the light being wave-guided is 850 nm or so. Thereupon, shrouding the circumference of the core made of SiON (SiON exhibiting an optical transmission property that the loss can be ignored over a wide range of wavelengths) in the clad made of $SiO_2$ yields the refractive index difference of 3% or more. And, entrapment of the light becomes weaker as compared with the case of employing the semiconductor core, and the light spot diameter becomes 1 to 4 μm or so.

By laminately arranging the structure, in which the surface plasmon is induced and yet the light is entrapped, and the light absorption layer adjacently to such an optical waveguide path having a strong light entrapment property, the optical coupling in a very tiny region is enabled. And, the photodiode that enables a compatibility of the high sensitivity and the high speediness is realized.

A gas cluster ion beam (a gas cluster ion beam obtained by ionizing Ar or reactive gas as a cluster that is comprised of several hundreds or several thousands of atoms or molecules) is desirably employed for forming a pattern of the conductive material capable of inducing the surface plasmon rather than a lift-off process using a resist mask. That is, employing the gas cluster ion beam leads to an enhancement in a working precision. Further, the working process having little damage is realized as compared with the case of employing an ion beam etching. At this time, the etched metal residual is released into a vacuum. Or, it sticks to a side wall of the resist mask. For this, the residual can be efficiently removed simultaneously with the resist. Thus, applying it for an LSI process leads to an enhancement in the yield. And, the device can be gained at a low cost.

The wavelength region of the light in which the present invention is available extends over a wide wavelength range including visible light, near infrared-ray light, and infrared-ray light. A fast photodiode for efficiently generating the photocarrier and gaining the electric signal in the very small region is obtained owing to the metal periodic structure for inducing the surface plasmon resonance, the channel type optical waveguide path for efficiently entrapping and transmitting the light, and the regulation of the size of the photonic crystal optical waveguide path.

Figure 4:
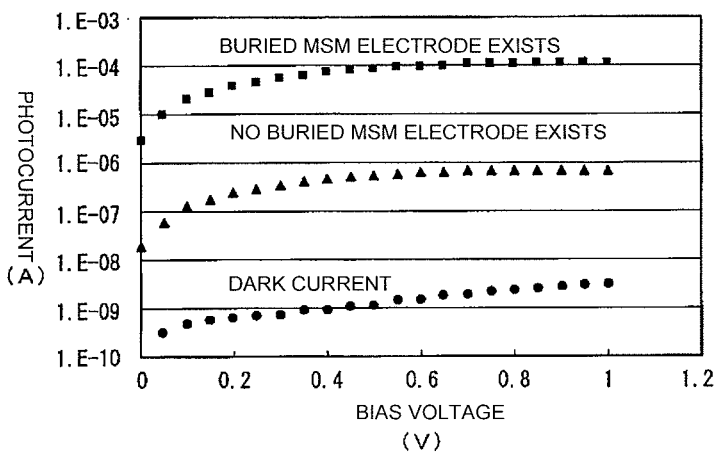
FIG. 4 is a feature diagram of the waveguide path coupling-type photodiode.

FIG. 4 shows a result of measuring a feature of the waveguide path coupling-type photodiode manufactured by way of trial.

Herein, the semiconductor light absorption layer 2 was configured of Si, and the MSM electrode 3 of a Ag electrode of thickness 30 nm. And, the sensitivity feature in the case of having formed the MSM electrode 3 on the surface of the semiconductor light absorption layer 2 (the MSM electrode 3 was not buried into the semiconductor light absorption layer 2), and the sensitivity feature in the case of having buried the MSM electrode 3 into the semiconductor light absorption layer 2 at a depth of 30 nm were investigated. The interval between the comb tooth of one MSM electrode 3 and the comb tooth of the other MSM electrode 3 (the interval between the electrodes) is 90 nm. Further, a width of the comb tooth in the MSM electrode 3 is 90 nm. In this case, the resonance wavelength of the surface plasmon is 850 nm judging from the calculation of the electromagnetic field. Thereupon, the laser light of which the wavelength and the power are 850 nm, and 1 mW, respectively, was made incident, and a photocurrent was observed. The following can be seen from FIG. 4. In the case of having buried the Ag electrode into the Si semiconductor, the photocurrent larger by two digits or more was obtained as compared with the case of not burying it. And the quantum efficiency at this time was 30% or so.

Figure 5:
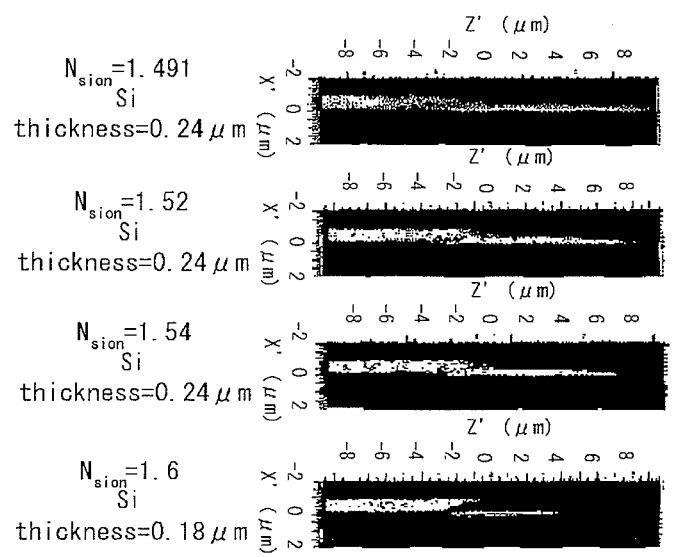
FIG. 5 is a view illustrating a result of calculating an electromagnetic field distribution due to the optical coupling of the optical waveguide path and the Si photodiode.

FIG. 5 shows a result of calculating the electromagnetic field distribution due to the optical coupling of the optical waveguide path and the Si photodiode. Herein, SiON was employed as the optical waveguide path core 1, and $SiO_2$ as the upper clad layer 4 and the lower clad layer 5. It can be seen that when the refractive index of SiON is changed from 1.491 (equivalent to the fact that the refractive index difference with the clad is 2.7%) to 1.6 (equivalent to the fact that the refractive index difference with the clad is 8.9%), the optical coupling length is changed from 10 μm to 6 μm. That is, making a refractive index difference between the optical waveguide path core 1 and the light absorption layer 2 small enables the more efficient optical coupling to be realized. And, the electric capacity in the junction of the photodiode becomes small, and the high speediness of 20 GHz or more is realized.

Embodiment 2

Figure 6:
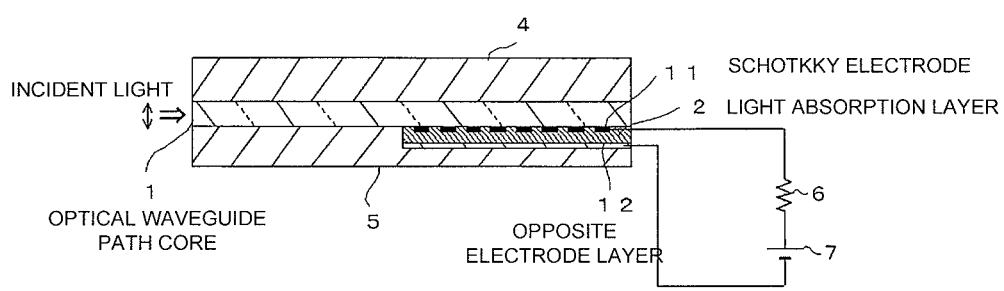
FIG. 6 is a cross sectional view of the waveguide path coupling-type photodiode of a second embodiment.

FIG. 6 is a cross sectional view illustrating the second embodiment of the present invention.

This embodiment is an example of the Schottky junction type photodiode.

This waveguide path coupling-type photodiode, similarly to the case of the first embodiment, has the semiconductor light absorption layer 2 formed adjacently to the optical waveguide path core 1. Further, similarly to the case of the first embodiment, the clad layer is formed around the optical waveguide path core 1. And, one electrode 11 (the comb type electrode similarly to the case of the first embodiment: the distance between the comb tooth is (1/100)λ to λ (where λ: a wavelength of the light that propagates through the optical waveguide path core)), out of one pair of the electrodes, is formed as a Schottky electrode. This Schottky electrode 11, similarly to the case of the first embodiment, is one formed in the boundary portion (interface portion) between the semiconductor light absorption layer 2 and the optical waveguide path core 1. Further, the Schottky electrode 11, similarly to the case of the first embodiment, is one buried into the semiconductor light absorption layer 2. Additionally, the Schottky junction is made between the Schottky electrode 11 and the semiconductor light absorption layer 2. The other electrode (opposite electrode layer) 12 being formed for the Schottky electrode 11 is formed in a side opposite to the side of the Schottky electrode 11 with the semiconductor light absorption layer 2 put between the electrodes.

The Schottky electrode 11, similarly to the case of the first embodiment, is configured of the conductive material capable of inducing the surface plasmon.

And, in the case of making a configuration as mentioned above, the depletion layer region of 200 nm or more is formed at a doping concentration of $1 \times 10^{15}$ to $1 \times 10^{16}$ cm$^{-3}$ notwithstanding the zero bias. Thus, making the distance between the electrodes small allows the high-speed/high-sensitivity photodiode to be attained notwithstanding the low bias voltage.

For example, when the thickness of the semiconductor light absorption layer 2 is 500 nm or so, the drift time of the photocarrier between the electrodes is several picoseconds also in the semiconductor material of which a mobility of the photocarrier is $10^7$ cm/s, for example, Si. The drift time becomes 20 ps or less also in the case that the thickness of the semiconductor light absorption layer 2 is 1 μm or so. Further, when the distance between the MSM electrodes is 100 nm or so, and the MSM junction area is 10 μm$^2$ or less, the electric capacity in the junction becomes 10 fF or less. Further, the electric capacity in the junction becomes 100 fF or less also in the case that the MSM junction area is 100 μm$^2$ or less. That is, when it is assumed that the load resistance is 50Ω, the circuit time constant becomes 1 ps, 10 ps, respectively. Thus, the very fast response is realized.

An n$^+$-Si layer of which a concentration of a dopant such as P is $1 \times 10^{20}$ cm$^{-3}$ or more can be used as a substrate in the opposite electrode layer 12. In this case, it is necessary to epitaxial-grow an n-Si layer as the light absorption layer 2 on the n$^+$-Si layer. At this time, the dopant concentration of the light absorption layer 2 becomes high due to a thermal diffusion of the dopant element when a growth temperature is raised to 800° C. or more. And, the depleting voltage is augmented. Further, the thickness of the depletion layer that is obtained at the time of forming the Schottky junction becomes thin. That is, fast driving at a low voltage becomes difficult to attain. Thus, the technology of the epitaxial growth at a low temperature equal to or less than 600° C. is desirably adopted in the case of forming the thin semiconductor light absorption layer 2 on the n$^+$-Si layer.

It is possible to yield an optical electric field enhancement effect due to the surface plasmon resonance not only in the horizontal direction between the electrodes but also in the lower part of the electrode. In this embodiment, the design such that the optical electric field enhancement due to the surface plasmon was yielded in the Schottky junction of the lower part of the electrode was made. And, the region in which the photocarriers were generated, and the region being depleted by applying the bias voltage were caused to coincide with each other. With this, similarly to the case of the MSN junction structure, the photodiode in which the high efficiency and the high speediness were compatible with each other was attained.

Embodiment 3

Figure 7:
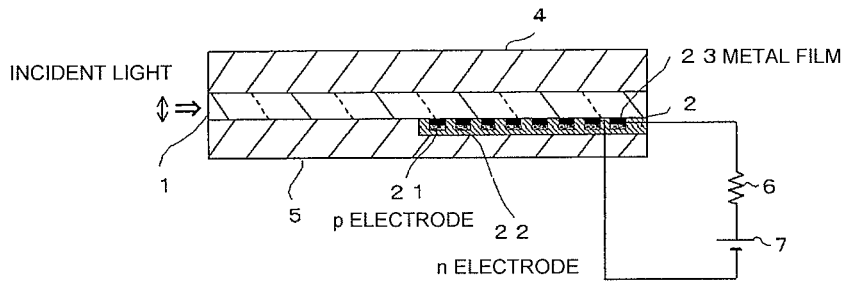
FIG. 7 is a cross sectional view of the waveguide path coupling-type photodiode of a third embodiment.

FIG. 7 is a cross sectional view illustrating the third embodiment of the present invention.

This embodiment is an example of the pin type photodiode.

This waveguide path coupling-type photodiode, similarly to the case of the first and second embodiments, has the semiconductor light absorption layer 2 formed adjacently to the optical waveguide path core 1. Further, similarly to the case of the first and second embodiments, the clad layer (the upper clad layer 4 and the lower clad layer 5) is formed around the optical waveguide path core 1.

And, one electrode (the comb type electrode), out of one pair of the electrodes, is configured with a layered structure of a metal film 23 and a p electrode 21. The other electrode (the comb type electrode), out of one pair of the electrodes, is configured with a layered structure of the metal film 23 and an n electrode 22. Thus, the p-i-n junction is configured of the electrodes of this embodiment and the semiconductor light absorption layer 2. The metal film 23 formed above the p electrode 21 and the n electrode 22 is configured of the conductive material capable of inducing the surface plasmon. Additionally, the distance between the comb tooth, and the buried depth into the semiconductor light absorption layer 2 in the electrode of this embodiment are established similarly to the case of the first embodiment.

Also in the pin type photodiode having the lateral electrode structure like the case of this embodiment, the metal film 23 buried into the light absorption layer 2 entraps the light energy into the light absorption layer 2 neighboring the $p^+$ electrode 21 and the $n^+$ electrode 22 due to the surface plasmon. And, this causes the optical electric field that is locally strong to occur.

It is reported that in the pin type photodiode having the lateral electrode structure, making the distance between the electrodes short enables the high speediness to be realized. As a matter of fact, making a configuration as mentioned above yields the photodiode having both of the high speediness and the high-efficient sensitivity feature. In addition, the conductive material capable of inducing the surface plasmon, as a rule, has a high conductivity. Thus, the impedance in the high-frequency band of the miniaturized photodiode can be made small. Thus, the photodiode having a high S/N in the high-frequency band besides the high speediness/high sensitivity feature is attained.

In this embodiment, the SOI (Silicon-on-Insulator) substrate is employed, and at first, a trench structure of which the interval is smaller than a wavelength of the light ($\lambda$) is formed with the reactive etching employing $C_4F_8$ or $SF_6$. And, B ion (or P ion) is inserted by employing $SiO_2$ (or $SiN_x$) etc. as a mask, and a pin junction is formed. Additionally, also by selectively growing a p type poly-silicon layer and an n type poly-silicon layer with CVD, the pin junction can be formed. At this time, the selective growth is forced to be stopped in the way to the formation of the trench structure. And, Al (or, Au, Ag, and Cu) is laminated as the metal film 23 via the underlayer (the underlayer such as Ti for improving adhesion to the ploy-silicon layer). Additionally, the insulating layer such as $SiO_2$ of which the thickness is several nanometers or so may be inserted between the metal film 23 and the light absorption layer (i-layer) 2. This suppresses a dark current.

In this embodiment, making a design so that the proximity field light enhancement due to the surface plasmon is yielded in the light absorption layer (i-layer) 2 put between the metal films 23 makes it possible to realize the quantum efficiency of 50% or more also in Si photodiode. Additionally, manufacturing the photodiode in which the Ge layer has been grown as the light absorption layer 2 enables the quantum efficiency of 90% or more to be attained.

Embodiment 4

Figure 8:
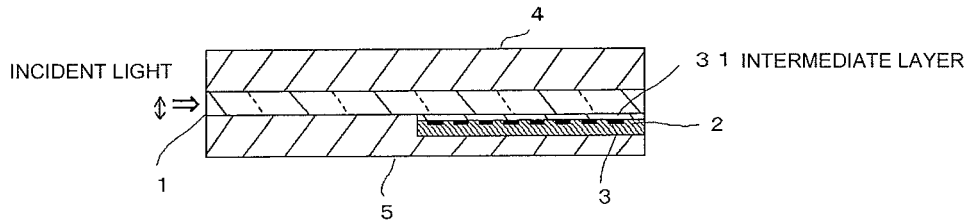
FIG. 8 is a cross sectional view of the waveguide path coupling-type photodiode of a fourth embodiment.

FIG. 8 is a cross sectional view illustrating the fourth embodiment of the present invention.

The photodiode of this embodiment is a photodiode obtained by forming an intermediate layer 31 between the light absorption layer 2 and the optical waveguide path core 1 for the photodiode of the first embodiment. Additionally, this intermediate layer 31 is a layer of which the refractive index is a value of n. The value of the refractive index of the light absorption layer 2 is ns. The value of the refractive index of the optical waveguide path core 1 is ncore. These refractive indexes satisfy a relation equation [ncore≦n≦ns]. In particular, they satisfy a relation equation [ncore<n<ns]. With this, the optical coupling efficiency between the optical waveguide path core 1 and the light absorption layer 2 can be improved.

Figure 9:
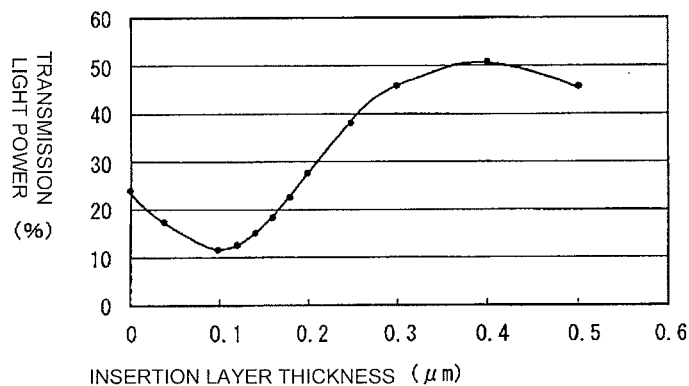
FIG. 9 is a graph of a transmission light power for a film thickness of an intermediate layer.
Figure 10:
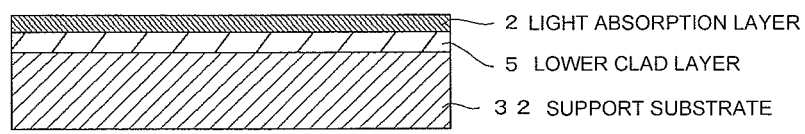
FIG. 10 is a manufacturing process view of the waveguide path coupling-type photodiode of the fourth embodiment.

FIG. 9 is a graph of a transmission light power for a film thickness of the intermediate layer 31.

SiON (the refractive index is 1.515) was employed as the optical waveguide path core 1, Si as the light absorption layer 2, and a $AlO_x$ layer (the refractive index is 1.63 or so: which is a value between the value of the refractive index of the optical waveguide path core 1 made of SiON and the value of the refractive index of the light absorption layer 2 made of Si) as the intermediate layer 31. At this time, it can be seen that the optical coupling efficiency is particularly improved in the case that the thickness of an insertion layer 31 is 40 nm to 140 nm or so. That is, it can be seen that the transmission light power is decreased as compared with the case of not inserting the $AlO_x$ layer. Additionally, it is shown in FIG. 5 that the optical coupling length is made long when the refractive index of the optical waveguide path core 1 is small. However, it was confirmed that also by inserting between the optical waveguide path core 1 and the semiconductor light absorption layer 2 a transparent dielectric substance layer having the refractive index of which the value is an intermediate value of the values thereof, an effect similar to the effect obtained by enlarging the refractive index of the optical waveguide path core 1 was attained. And, the waveguide path coupling-type photodiode having the high quantum efficiency (for example, 60%) was attained.

Each of FIG. 10 to FIG. 17 is a manufacturing process view of the waveguide path coupling-type photodiode of this embodiment.

Herein, the case of employing Si as the light absorption layer 2 will be explained.

At first, an n-doped SOI substrate is employed. This SOI substrate has a structure in which the buried oxide layer and the semiconductor layer (SOI layer) have been laminated on a support substrate 32. This SOI substrate is subjected to a working process (see FIG. 10). That is, the buried oxide layer is processed as one part of the lower clad layer 5. One part of the semiconductor layer is processed as the light absorption layer 2. Additionally, resistivity of the semiconductor layer is 1 to 10Ω·cm or so. The doping concentration is $1 \times 10^{15}$ to $1 \times 10^{16}$ $cm^{-3}$ or so.

Figure 11:
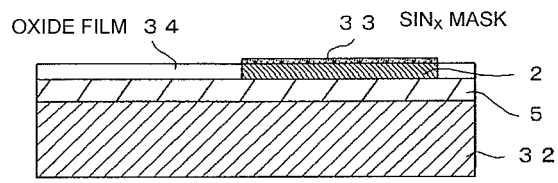
FIG. 11 is a manufacturing process view of the waveguide path coupling-type photodiode of the fourth embodiment.
Figure 12:
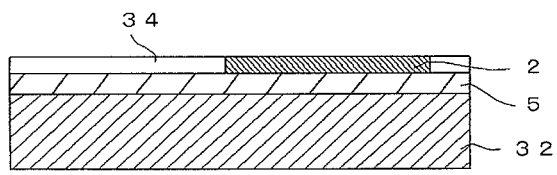
FIG. 12 is a manufacturing process view of the waveguide path coupling-type photodiode of the fourth embodiment.
Figure 13:
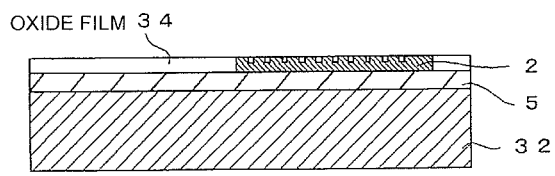
FIG. 13 is a manufacturing process view of the waveguide path coupling-type photodiode of the fourth embodiment.
Figure 14:
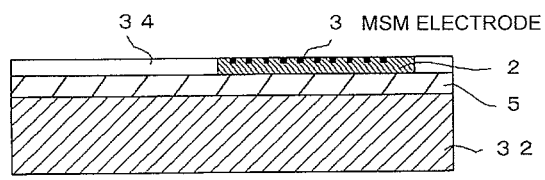
FIG. 14 is a manufacturing process view of the waveguide path coupling-type photodiode of the fourth embodiment.

Next, the n-type SOI layer is patterned with the reactive etching by employing a $SiN_X$ film 33 as a mask (see FIG. 11). That is, the junction size is specified. A mixture gas of $C_4F_8$ gas and $SF_6$ gas was employed as reactive gas. And, the heat treatment (vapor treatment) was performed for this at 1000° C. and for 140 minutes or so. With this, a mesa structure, being a foundation for the MSM junction, is formed.

Thereafter, the $SiN_X$ film 33 was put in hot phosphoric acid of which the temperature was approximately 130° C. for approximately one hour. With this, the $SiN_X$ film 33 (mask) was removed (see FIG. 12). Additionally, at this time, by optimizing the hot oxidation process, a relatively flat surface is realized. Further, by performing the chemical mechanical polishing (CMP), the flatness of several nanometers or so is realized.

The metal layer for forming the Schottky junction is film-formed on the surface of the mesa shape prepared as mentioned above. For example, the grooved pattern is formed on the mesa surface of the semiconductor with the reactive etching (see FIG. 13). And, the MSM electrode 3 is formed by employing the lift-off method utilizing the resist mask prepared with the reactive etching (see FIG. 14). Or, after laminating the metal electrode film, the resist pattern is formed. And, the MSM photodiode having a structure in which the MSM electrode 3 has been buried into the light absorption layer 2 may be prepared with the etching method using the Ar gas cluster ion. Additionally, adjusting the distance between the metal patterns being formed in the groove portion makes it possible to generate the plasmon resonance with a desired wavelength. And, the light receiving efficiency of the MSM photodiode can be improved by a factor of two digits to three digits or so.

Figure 15:
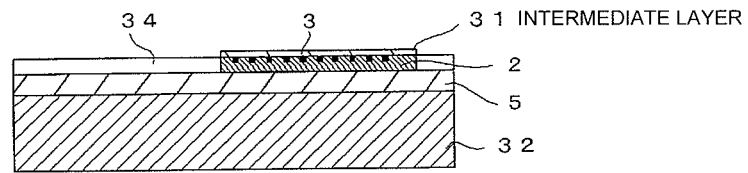
FIG. 15 is a manufacturing process view of the waveguide path coupling-type photodiode of the fourth embodiment.

The intermediate layer 31 is formed on the MSM photodiode prepared as mentioned above by employing the material (for example, $AlO_x$) of which the optical absorption can be ignored (see FIG. 15). This intermediate layer 31 is a layer that becomes a medium at the moment of optically coupling the optical waveguide path core 1 being formed on the MSM photodiode and the MSM photodiode. The refractive index n of the intermediate layer is a value mentioned above. Additionally, the optical coupling efficiency of the optical waveguide path core 1 and the light absorption layer 2 is improved owing to the intermediate layer 31.

Figure 16:
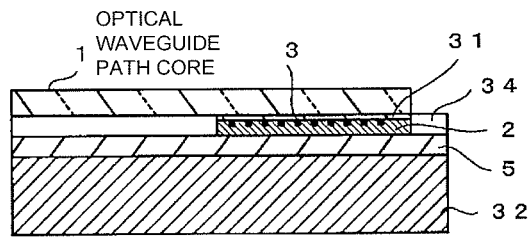
FIG. 16 is a manufacturing process view of the waveguide path coupling-type photodiode of the fourth embodiment.
Figure 17:
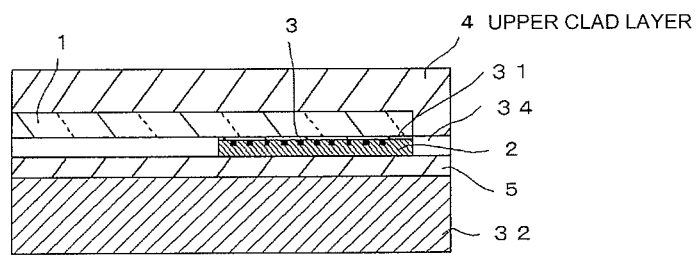
FIG. 17 is a manufacturing process view of the waveguide path coupling-type photodiode of the fourth embodiment.

Next, the SiON layer (the optical waveguide path core 1) is grown with an ECR plasma CVD method using $SiH_4$ (or $SiCl_4$) gas, $N_2$ gas, and $O_2$ gas so that a difference between the refractive index of the core and that of the clad is 3% or more (see FIG. 16). Thereafter, for a purpose of yielding the core shape, the SiON layer is subjected to the working process into a rectangular shape having a width of 0.7 to 4 µm with the reactive etching method. Additionally, the intermediate layer 31 exhibits a role as an etching stopper at the moment that the optical waveguide path core 1 is patterned with the etching. That is, a $AlO_x$ layer 31 existing just above the grating for causing the surface plasmon resonance stops the etching working process.

Finally, the $SiO_2$ layer was grown into a layer having a thickness of several microns or so with a plasma CVD method using mixture gas of TEOS (tetraethylorthosilicate) bubbled with a large amount of Ar, and $O_2$. With this, the upper clad layer 4 is formed (see FIG. 17).

Additionally, in the above-mentioned explanation, the case that the intermediate layer 31 was $AlO_x$ was exemplified. However, the situation is similar with the case of employing silicon oxide, tantalum oxide, zirconium oxide, or hafnium oxide beside alumina. Further, the situation is similar with the case of employing the layered film of two ceramics or more, out of the foregoing ceramics.

Embodiment 5

Figure 18:
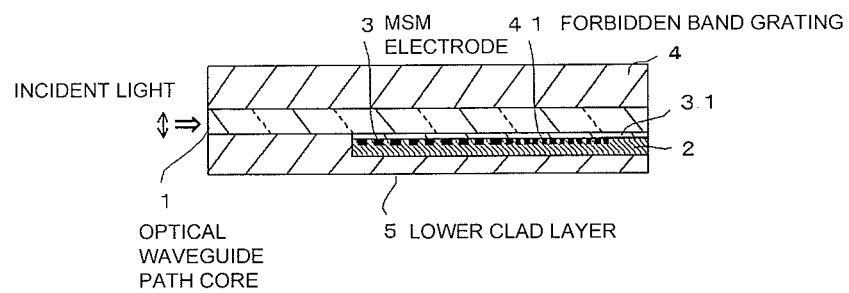
FIG. 18 is a cross sectional view of the waveguide path coupling-type photodiode of a fifth embodiment.

FIG. 18 is a cross sectional view illustrating the fifth embodiment of the present invention.

The photodiode of this embodiment is a photodiode obtained by forming a metal grating structure for the photodiode of the fourth embodiment. That is, the electrode (the comb type electrode) 3 is formed in the boundary portion between the semiconductor light absorption layer 2 and the optical waveguide path core 1. The light propagates through the optical waveguide path core 1 from the left side to the right side in FIG. 18. And, in FIG. 18, the metal grating structure (a forbidden band grating 41) is formed in a right-side position, namely, in a right-side position of the comb type electrode 3. This metal grating structure prevents the light having propagated through the optical waveguide path core 1 from causing the surface plasmon resonance. However, the light is reflected. That is, the forbidden band grating 41 reflects the light not optically coupled with the light absorption layer 2. This enables the coupling length between the light absorption layer 2 and the optical waveguide path core 1 to be shortened.

The forbidden band grating 41 forms a forbidden band that prevents the plasmon resonance from being generated. The period thereof, which depends upon the neighboring dielectric substance layer, is expressed with λ/2 neff (neff is an effective refractive index of the dielectric substance layer neighboring the metal grating). For example, the metal grating structure (forbidden band grating 41) configured by arranging metal slit array structures within the light absorption layer 2 made of Si at a period of 90 nm or so exhibits a reflection feature of 90% or so. And the optical coupling length can be shortened. Additionally, the period of the metal grating structure that prevents the surface plasmon resonance to be generated depends upon the refractive index of the dielectric substance layer neighboring the metal grating. Thus, arranging the metal slit array structures adjacently to the clad layer of which the refractive index is small allow the forbidden band to be formed at a longer period of the metal grating as compared with the case of arranging them in the light absorption layer 2. Further, the forbidden band grating is prepared easily.

Additionally, herein, the case of adding the forbidden band grating 41 to the photodiode of the fourth embodiment was explained. However, even though the forbidden band grating 41 is added to the photodiode of each of the first, second, and third embodiments, the similar characteristic is exhibited.

Embodiment 6

Figure 19:
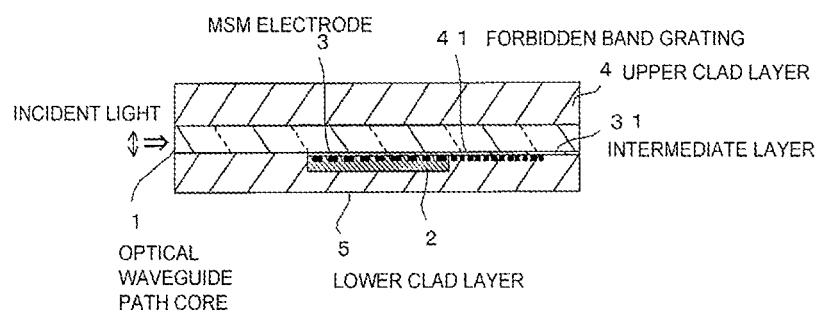
FIG. 19 is a cross sectional view of the waveguide path coupling-type photodiode of a sixth embodiment.

FIG. 19 is a cross sectional view illustrating the sixth embodiment of the present invention.

In the fifth embodiment, the forbidden band grating 41 was formed in the light absorption layer 2. On the other hand, in this embodiment, as apparent from FIG. 19, the forbidden band grating 41 was formed in the lower clad layer 5 of which the refractive index was small. This point is a point in which the fifth embodiment and sixth embodiment differ from each other. And, with the case that the lower clad layer 5 is a layer made of $SiO_2$, the forbidden band is formed at a longer period, being 240 nm or so, as compared with the case of arranging the forbidden band grating 41 in the Si light absorption layer 2. Thus, the forbidden band grating is prepared easily.

Embodiment 7

Figure 20:
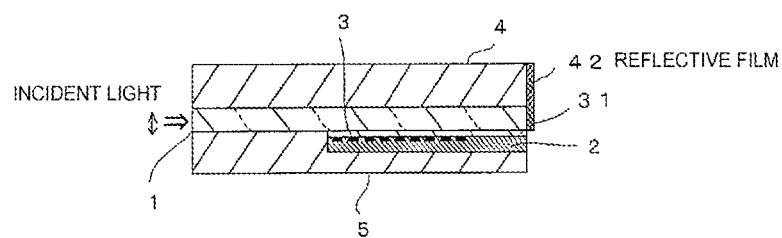
FIG. 20 is a cross sectional view of the waveguide path coupling-type photodiode of a seventh embodiment.

FIG. 20 is a cross sectional view illustrating the seventh embodiment of the present invention.

The photodiode of this embodiment is a photodiode obtained by additionally forming a reflective film 42 for the waveguide path coupling-type photodiode of the fourth embodiment (FIG. 8). That is, the electrode (the comb type electrode) 3 is formed in the boundary portion between the semiconductor light absorption layer 2 and the optical waveguide path core 1. The light propagates through the optical waveguide path core 1 from the left side to the right side in FIG. 20. And, in FIG. 20, the reflective film 42 is formed in a right-side position of the optical waveguide path core 1 (in a right-hand position of the comb type electrode 3: particularly, in a right end surface). This reflective film 42 makes it possible to reflect back the light having propagated through the optical waveguide path core 1 without being optically coupled. Thus, the coupling length of the optical waveguide path core 1 and the light absorption layer 2 can be shortened.

Additionally, herein, the case of adding the reflective film 42 to the photodiode of the fourth embodiment was explained. However, even though the reflective film 42 is added to the photodiode of each of the first, second, and third embodiments, the identical characteristic is exhibited.

Embodiment 8

Figure 21:
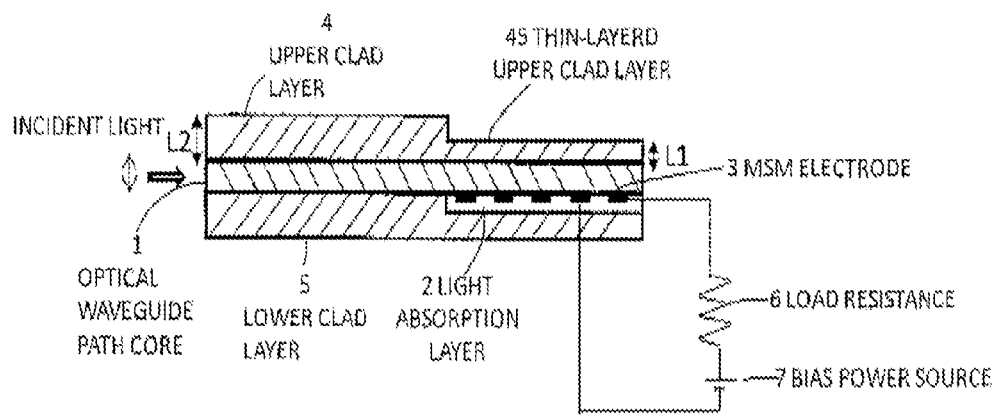
FIG. 21 is a cross sectional view of the waveguide path coupling-type photodiode of an eighth embodiment.

FIG. 21 is a cross sectional view illustrating the eighth embodiment of the present invention.

In this embodiment, the thickness of the upper clad layer was changed. That is, the thickness of the upper clad layer of the waveguide path coupling-type photodiode of the first embodiment is identical over an entire region (FIG. 1). On the other hand, as apparent from FIG. 21, the waveguide path coupling-type photodiode of this embodiment includes the upper clad layer 4 of which thickness has been thinned in a position in which the semiconductor light absorption layer 2 (electrode 3) has been formed. That is, in FIG. 21, as shown by a code 45, the thickness of the upper clad layer has been thinned in a region in which it faces the semiconductor light absorption layer 2 (electrode 3). This point is a point in which the first embodiment and the eighth embodiment differ from each other. And, making a configuration in such a manner allows a mode field of the energy of the light propagating through the optical waveguide path to be push down toward the light absorption layer 2 side. Thus, the high-efficient optical coupling is realized.

Additionally, herein, the photodiode of this embodiment is a photodiode obtained by partially thinning the thickness of the upper clad layer 4 for the photodiode of the first embodiment. However, even though the same thing is done for the photodiode of each of the second to seventh embodiments, the identical characteristic is exhibited.

Embodiment 9

Figure 22:
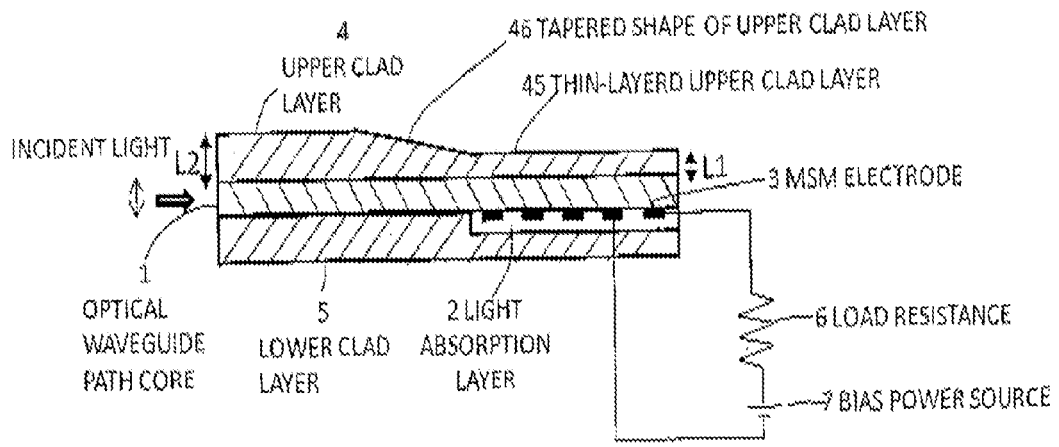
FIG. 22 is a cross sectional view of the waveguide path coupling-type photodiode of a ninth embodiment.

FIG. 22 is a cross sectional view illustrating the ninth embodiment of the present invention.

A point in which the eighth embodiment differs from this embodiment is quite obvious, judging from a comparison of FIG. 21 and FIG. 22. That is, the difference is only whether the thickness of a point transiting from the upper clad layer 4 having a thick thickness to the upper clad layer 45 having a thin thickness has been changed stepwise or gradually. Changing the thickness by way of monotonous decrease makes it possible to improve the reflection of the light caused by impedance unconformity in the optical waveguide path connection portion and a bad influence by light scatter. And, the optical waveguide path core 1 and the light absorption layer 2 are optically coupled more efficiently.

Additionally, herein, the photodiode of this embodiment is a photodiode obtained by changing the thickness of the upper clad layer 4 for the photodiode of the first embodiment as mentioned above. However, even though the same thing is done for the photodiode of each of the second to seventh embodiments, the identical characteristic is exhibited.

Embodiment 10

Figure 23:
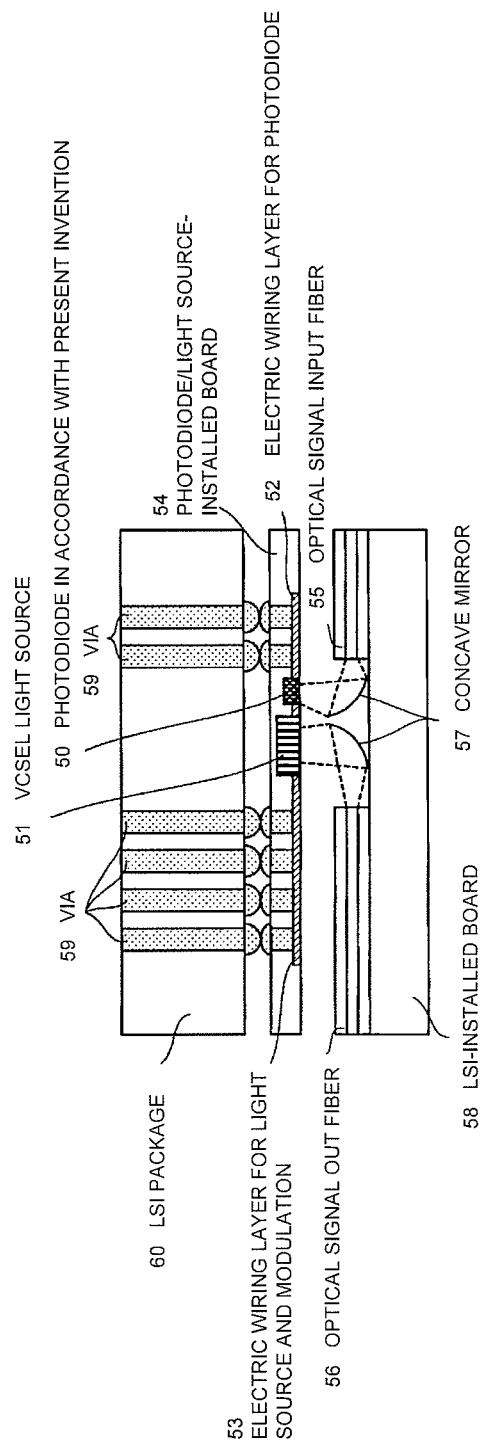
FIG. 23 is a schematic view of a tenth embodiment.

FIG. 23 is a schematic view illustrating the tenth embodiment of the present invention.

The present invention of this embodiment relates an optical wiring system on the integrated circuit provided with the above mentioned waveguide path coupling-type photodiode in the light receiving portion thereof. In particular, it relates to an LSI inter-chip optical interconnect.

The above-mentioned optical wiring system includes a photodiode/light source-installed board 54, an LSI-installed board 58, and an LSI package 60.

A waveguide path coupling-type photodiode 50, a VCSEL (Vertical-Cavity Surface-emitting Laser) light source 51 provided with an electric modulation mechanism, an electric wiring layer for photodiode 52, and an electric wiring layer for a light source and a modulation 53 in accordance with the present invention mentioned above are monolithically formed on the Si substrate of the photodiode/light source-installed board 54.

An optical signal input fiber 55, an optical signal output fiber 56, and a concave mirror 57, which aim for carrying out the inputting/outputting of the light signal between the photodiode 50 and the VCSEL light source 51, are formed on the LSI-installed board 58.

A via 59 for electrically making a connection to the photodiode 50 and the VCSEL light source 51 is formed on the LSI package 60.

And, the optical signal coming from an optical signal input fiber 55 is radiated into the end surface of the photodiode 50 by the concave mirror 57. With the case of employing the light of which the wavelength is 850 nm, the semiconductor material of the photodiode 50 is Si. And the period of the metal film pattern for causing the surface plasmon resonance is 180 to 200 nm. The photodiode 50 made of Si converts the light propagating through the waveguide path core layer made of SiON into the proximity field light, thereby to optically couple it. With this, a photocurrent is generated. And, this allows the current corresponding to the optical signal to flow to LSI through an electric wiring layer for photodiode 52. Additionally, performing a working process for the end surface of the waveguide path so that it becomes taper-shaped makes it possible to enlarge a coupling tolerance of the position between the concave mirror 57 and the waveguide path coupling-type photodiode 50 to ±1 µm or more.

The electric wiring layer for photodiode 52 is electrically connected to a circuit within the LSI package 60 through the via 59 formed in the LSI package 60. Herein, the other well-known means for using a planar optical waveguide path instead of the optical fiber can be employed for inputting the optical signal. Further, a focusing mechanism such as a convex lens can be employed instead of the concave mirror 57. Further, the preamp for amplifying the electric signal can be placed in the way to the electric wiring layer for photodiode 52 immediately after the photodiode.

The electric signal coming from the circuit within the LSI package 60, which goes through the electric wiring layer for a light source and a modulation 53 from the via 59, is converted into the optical signal by the VCSEL light source 51. The optical signal is reflected at the concave mirror 57, and sent to the optical signal output fiber 56. The VCSEL light source 51 can be replaced with the other means for modulating the light by electricity, for example, a Mach-Zehnder type modulator (modulator for modulating the light coming from an external light source with an electro-optical effect or a thermo-optical effect).

Herein, in the general LSI inter-chip interconnect, in the case of aiming at a fast operation of 20 GHz or more, the compound semiconductor material such as InGaAs grown on the InP substrate is employed for the photodiode being installed therein so as to make the response fast. As it is, the compound semiconductor has poor matching to the Si semiconductor element in terms of the manufacturing process, and hence becomes costly. However, the manufacturing cost of the photodiode in accordance with the present invention can be reduced because Si can be employed therefor. Additionally, as a result of the trial, the fast optoelectric conversion operation of 20 to 40 GHz was confirmed in the optical interconnect in accordance with the present invention shown in FIG. 23.

Embodiment 11

Figure 24:
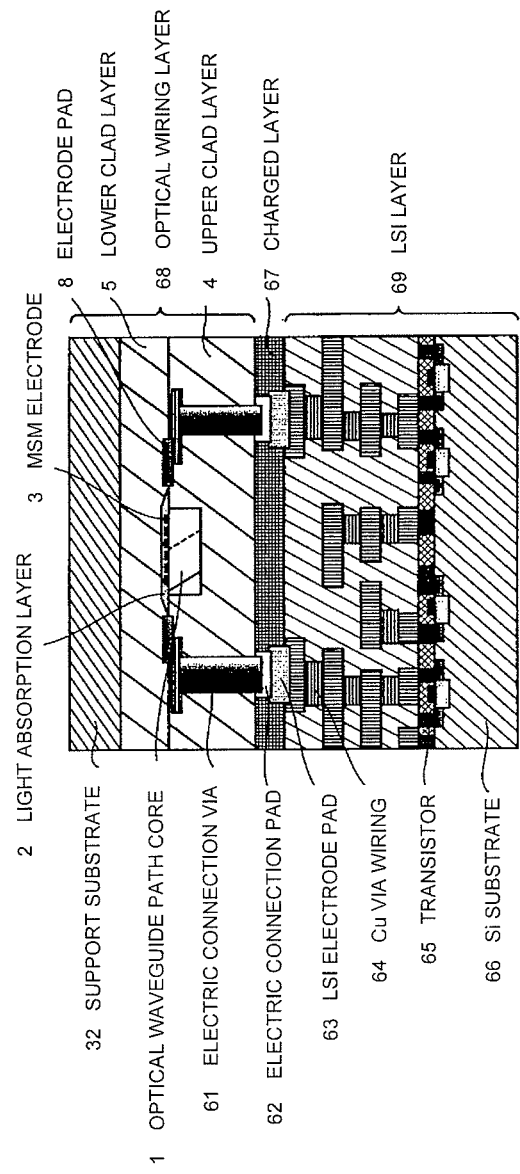
FIG. 24 is a schematic view of an eleventh embodiment.

FIG. 24 is a schematic view illustrating the eleventh embodiment of the present invention.

This embodiment is another embodiment of the optical wiring system on the integrated circuit provided with the above waveguide path coupling-type photodiode in the light receiving portion thereof.

In this embodiment, the above-mentioned waveguide path coupling-type photodiode, which has been integrated and converted into an optical wiring layer 68, is bonded to an LSI chip (LSI layer 69). The light signal propagating through the optical waveguide path core 1 is optically coupled by the MSM electrode 3 formed within the light absorption layer 2, and converted into an electric signal. And, it is connected to a transistor 65, being a TIA circuit, via an electric connection via 61, an electric connection pad 62, an LSI electrode pad 63, and a Cu via wiring 64. The optical wiring layer 68 and the LSI layer 69, which forms a layered structure of an alloy layer (or Au layer) that is comprised of Au—Sn, and a Sn layer on the surface of the electric connection pad 62, is bonded to the LSI electrode pad 63 by raising the temperature at 300° C. or so.

For such a layered chip, a coupling structure to the optical fiber is formed on the flank of the optical wiring layer 68. And, a clock signal that is comprised of light pulses of 10 GHz or more is inputted into it. With this, the optical clock signal transmitted from the optical waveguide path is optoelectrically converted at a high speed by the MSM photodiode, and becomes a current signal. In addition, the current signal is converted into a voltage signal by the transistor circuit 65 connected through the Cu via wiring 64. And, it was confirmed that an LSI logic circuit operated at a clock frequency of 10 GHz or more. At this time, jitter and skew were reduced as compared with the conventional clock signal delivery using the electric signal. The delay time as well was reduced by employing the transistor of which the gate width is 90 nm, and it was 70 ps or so. In addition, it was confirmed that by reducing the electric capacity of the MSM photodiode to 2 fF or less, the clock operation was realized with one-tenth as large as the conventional light power required conventionally.

In the explanation of the above-mentioned embodiments, the case of employing Si as a light absorption layer was exemplified. However, other IV-group element semiconductors such as Ge and SiGe can be employed instead of Si. Further, III-V-group compound semiconductors such as GaAs and InP can be also employed. Additionally, selection of these materials is decided based upon the wavelength limitation that is governed by a band gap and an absorption coefficient. With the case of Si, the excellent photodiode feature is gained in a wavelength of approximately 400 to 900 nm. With the case of Ge, the excellent photodiode feature is gained in a wavelength of approximately 400 to 1500 nm. With InGaAs grown on InP, the excellent photodiode feature is gained in a wavelength of nearly 1300 to 1600 nm.

In the case of employing Ge for the light absorption layer, a GOI (Germanium On Insulator) substrate can be employed instead of the SOI substrate. Further, growing a Ge layer having excellent crystallinity on Si by employing a CVD method using a GeH$_4$ gas source, or a molecular beam epitaxy method using a solid source makes it possible to form the light absorption layer. Additionally, it is known that the formation of the Schottky junction is difficult in the case of employing Ge. Thus, Ni etc. is vapor-deposited on Ge, and is annealed at a temperature of 400 to 600° C. or so. It is desirable that a NiGe alloy layer is formed with it, thereby to employ this layer as a Schottky junction. Further, by forming a film of which the propagation loss of the surface plasmon is small, for example, Ag (or Au) on the NiGe alloy layer, the coupling efficiency to the optical waveguide path is improved.

This application is based upon and claims the benefit of priority from Japanese patent application No. 2007-120897, filed on May 1, 2007, the disclosure of which is incorporated herein in its entirety by reference.

This application is based upon and claims the benefit of priority from Japanese patent application No. 2008-39893, filed on Feb. 21, 2008, the disclosure of which is incorporated herein in its entirety by reference.

HOW THE INVENTION IS CAPABLE OF INDUSTRIAL EXPLOITATION

The waveguide path coupling-type photodiode in accordance with the present invention is preferredly employed for a field of the photodiode in which the high integration and the low power consumption are required. For example, it is preferredly employed for the light receiving portion in the optical wiring system such as an optical interconnection module.

The invention claimed is:

1. A waveguide path coupling-type photodiode having a semiconductor light absorption layer and an optical waveguide path core formed adjacently to each other:
    wherein a pair of electrodes facing each other are formed in a boundary portion between said semiconductor light absorption layer and said optical waveguide path core, said electrodes being comprised of at least one layer;
    wherein said electrodes are formed at an interval of $(1/100)\lambda$ to $\lambda$, (where $\lambda$: a wavelength of light that propagates through said optical waveguide path core);
    wherein at least one part of said electrodes is buried into said semiconductor light absorption layer;
    wherein at least one layer of said electrodes is configured of a material capable of inducing a surface plasmon; and
    wherein a clad layer is formed for said optical waveguide path core,
    wherein said clad layer is configured so that a thickness L1 and a thickness L2 thereof meet a thickness L1<a thickness L2 (where the thickness L1: a thickness of said clad layer at a position in which said clad layer faces said electrodes, with said optical waveguide path core put between said clad layer and said electrode, and the thickness L2: a thickness of said clad layer at a position in which said clad layer is laminated on said optical waveguide path core through which the light propagates).

2. The waveguide path coupling-type photodiode as claimed in claim 1;
    wherein a metal-semiconductor-metal junction is configured of said electrodes and said semiconductor light absorption layer.

3. The waveguide path coupling-type photodiode as claimed in claim 2, wherein said metal-semiconductor-junction that is configured of said electrodes and said semiconductor light absorption layer is a Schottky barrier type junction.

4. The waveguide path coupling-type photodiode as claimed in claim 1:
   wherein one electrode, out of said electrodes facing each other, is configured of a lamination of said material capable of inducing the surface plasmon and a p electrode,
   wherein the other electrode, out of said electrodes facing each other, is configured of a lamination of said material capable of inducing the surface plasmon and an n electrode: and
   wherein a p-i-n junction is configured of said electrodes and said semiconductor light absorption layer.

5. The waveguide path coupling-type photodiode as claimed in claim 1:
   wherein one electrode, out of the electrodes facing each other, is formed in the boundary portion of said semiconductor light absorption layer and said optical waveguide path core;
   wherein the other electrode, out of the electrodes facing each other, is formed in a side opposite to a side of said one electrode with said semiconductor light absorption layer put between both electrodes; and
   wherein a metal-semiconductor junction that is configured of said one electrode and said semiconductor light absorption layer is a Schottky barrier type junction.

6. The waveguide path coupling-type photodiode as claimed in claim 1:
   wherein an intermediate layer is formed in the boundary portion between said semiconductor light absorption layer and said optical waveguide path core; and
   wherein said intermediate layer is a layer of which a refractive index n is ncore to ns (where ncore: a refractive index of said optical waveguide path core, and ns: a refractive index of said semiconductor light absorption layer).

7. The waveguide path coupling-type photodiode as claimed in claim 1, wherein a metal grating structure for preventing light having propagated through said optical waveguide path core from causing a surface plasmon resonance, and reflecting the light, is formed in a position of a side opposite to a side in which the light propagates through said optical waveguide path core, with said electrodes formed in the boundary portion between said semiconductor light absorption layer and said optical waveguide path core put between both sides.

8. The waveguide path coupling-type photodiode as claimed in claim 1, wherein a reflective film is formed in an end surface of said optical waveguide path core existing in a position of a side opposite to a side in which the light propagates through said optical waveguide path core, with said electrodes formed in the boundary portion between said semiconductor light absorption layer and said optical waveguide path core put between both sides.

9. The waveguide path coupling-type photodiode as claimed in claim 1, wherein the thickness of said clad layer is taperedly changed in a boundary between said thickness L1 and said thickness L2.

10. The waveguide path coupling-type photodiode as claimed in claim 1, wherein a junction area in an interface between said electrodes and said semiconductor light absorption layer is 100 μm² or less.

11. The waveguide path coupling-type photodiode as claimed in claim 1, wherein a junction area in an interface between said electrodes and said semiconductor light absorption layer is 10 μm² or less.

12. The waveguide path coupling-type photodiode as claimed in claim 1, wherein said semiconductor light absorption layer is 1 μm or less in its thickness.

13. The waveguide path coupling-type photodiode as claimed in claim 1, wherein said semiconductor light absorption layer is 500 nm or less in its thickness.

14. The waveguide path coupling-type photodiode as claimed in claim 1, wherein said material capable of inducing the surface plasmon is one material, or two materials or more selected from a group consisting of Al, Ag, Au, Cu, and an alloy thereof.

15. The waveguide path coupling-type photodiode as claimed in claim 6, wherein said intermediate layer is configured of one material, or two materials or more selected from a group consisting of aluminum oxide, silicon oxide, tantalum oxide, zirconium oxide, hafnium oxide, and a composite thereof.

16. The waveguide path coupling-type photodiode as claimed in claim 1, wherein said optical waveguide path core is configured of SiON.

17. The waveguide path coupling-type photodiode as claimed in claim 1, wherein said semiconductor light absorption layer is configured of one material, or two materials or more selected from a group consisting of Si, $Si_xGe_{1-x}$ (where x is a number of 0 to 1), Ge, GaN, GaAs, GaInAs, GaInP, and InP.

18. The waveguide path coupling-type photodiode as claimed in claim 1:
   wherein said semiconductor light absorption layer is configured of one material, or two materials or more selected from a group consisting of $Si_xGe_{1-x}$ (where x is a number of 0 to 1) and Ge, and;
   wherein a Ni—Ge alloy layer is formed in a junction interface between said electrodes and said semiconductor light absorption layer.

19. An optical wiring system, wherein the waveguide path coupling-type photodiode of claim 1 is formed on a light receiving portion.

20. An optical interconnection module, comprising:
   a Si substrate having the waveguide path coupling-type photodiode of claim 1 formed thereon; and
   an electronic circuit formed monolithically with said waveguide path coupling-type photodiode on said Si substrate.

21. The waveguide path coupling-type photodiode as claimed in claim 1, wherein a buried depth of the one part of the electrodes buried into said semiconductor light absorption layer is a depth of a value equal to or less than $\lambda/(2\, ns)$ (where ns: a refractive index of said semiconductor light absorption layer).

* * * * *